United States Patent [19]

Jansen et al.

[11] Patent Number: 4,925,701

[45] Date of Patent: May 15, 1990

[54] PROCESSES FOR THE PREPARATION OF POLYCRYSTALLINE DIAMOND FILMS

[75] Inventors: Frank Jansen; Mary A. Machonkin, both of Webster, N.Y.

[73] Assignee: Xerox Corporation, Stamford, Conn.

[21] Appl. No.: 199,646

[22] Filed: May 27, 1988

[51] Int. Cl.$^5$ .............................................. B05D 3/06
[52] U.S. Cl. ..................................... 427/38; 427/45.1; 427/99; 427/162; 427/166; 427/168; 427/249; 427/255.1; 427/255.2; 427/294; 427/402
[58] Field of Search ................... 427/38, 45.1, 99, 162, 427/166, 168, 249, 255.1, 255.2, 294, 402; 428/408

[56] References Cited

U.S. PATENT DOCUMENTS

| | | | |
|---|---|---|---|
| 3,961,103 | 6/1976 | Aisenberg | 427/39 |
| 4,060,660 | 11/1977 | Carlson et al. | 428/408 |
| 4,434,188 | 2/1984 | Kamo et al. | 427/39 |
| 4,490,229 | 12/1984 | Mirtich et al. | 204/192 |
| 4,504,519 | 3/1985 | Zelez | 427/39 |
| 4,707,384 | 11/1987 | Schachner et al. | 427/249 |
| 4,725,345 | 2/1988 | Sakamoto et al. | 427/38 |

FOREIGN PATENT DOCUMENTS

| | | | |
|---|---|---|---|
| 628567 | 10/1961 | Canada . | |
| 59-184791 | 10/1984 | Japan | 427/38 |
| 61-166973 | 7/1986 | Japan | 427/38 |
| 61-183663 | 8/1986 | Japan | 427/38 |
| 61-193431 | 8/1986 | Japan | 427/38 |
| 61-193433 | 8/1986 | Japan | 427/38 |
| 2133068A | 6/1987 | Japan . | |
| 2138395A | 6/1987 | Japan . | |

OTHER PUBLICATIONS

"Growth of Diamond Seed Crystals by Vapor Deposition", J. C. Angus et al., Case Western Reserve Univ., vol. 39, No. 6, May 1968.

"New Method of Nucleating Diamond", Komanduri et al., Nature, vol. 248, Apr. 12, 1974, pp. 582-584.

*Primary Examiner*—Stanley Silverman
*Attorney, Agent, or Firm*—E. O. Palazzo; J. L. Byoriuk

[57] ABSTRACT

A process for the preparation of continuous polycrystalline diamond films which comprises applying to a substrate diamond powder in an amount of from about one particle per ten square microns to about 10 particles per square micron with an average particle diameter of from about 0.1 to about 0.4 micron; heating the resulting powdered substrate subsequent to incorporation in a processing apparatus; introducing a mixture of gases into the chamber, which gases provide a supply of carbon and hydrogen; and decomposing the gas mixture.

57 Claims, No Drawings

PROCESSES FOR THE PREPARATION OF POLYCRYSTALLINE DIAMOND FILMS

BACKGROUND OF THE INVENTION

This invention is generally directed to processes for the preparation of polycrystalline materials. More specifically, the present invention is directed to nucleation methods for the formation of polycrystalline films which films are useful in thermal transfer printing processes as protective coatings, and for heat conductive coatings in microelectronic circuits. In one embodiment of the present invention, there are provided processes for the preparation of polycrystalline diamond films wherein a suspension of diamond powder is applied to a substrate, and subsequently a mixture of gases is decomposed while heating the substrate, thereby enabling the nucleation of the appropriate decomposed gases. Thus, for example, there is initially applied to a substrate, such as a silicon wafer, diamond powder with certain parameters by spin coating, dip coating or spray coating methods, which powder functions primarily as a seeding, or nucleation source of the condensable vapor resulting from the decomposed gases. More specifically, in one embodiment of the present invention subsequent to heating the substrate as illustrated herein, there is introduced into a vacuum chamber gases or mixtures thereof. These gases serve as a source of carbon, and are decomposed by heating at high temperatures, for example 2,000° C. with a filament, or by plasma decomposition, thereby enabling the decomposed gases to deposit on the aforementioned substrate and permitting nucleation, resulting in the formation of the desired continuous polycrystalline diamond films. The process of the present invention has numerous advantages including the rapid growth of high purity polycrystalline diamond films; the avoidance of abrading the substrate as is the situation with many prior art processes; controlled nucleation thereby resulting in the growth of continuous films; and reproducible results.

Present methods for obtaining polycrystalline diamond films are believed to be inadeqate since the surfaces upon which these films are deposited require mechanical abrasion treatments, and this abrasion damages the surface of the substrate in that material is randomly removed therefrom, thus adversely affecting the optical transmission properties and otherwise damaging the structure of this layer which might also contain microelectronic devices. Further, with these processes undesirable nonuniform diamond films result, and such processes are usually irreproducible. More specifically, there is disclosed in the prior art the difficulties of diamond film nucleation by a method using mechanical abrasion of the substrate surface to cause diamond crystals to nucleate and grow into a continuous film. Thus, for example, there is illustrated in the *Journal of Applied Physics* 63 (1988) 1744, C. P. Chang, D. L. Flamm, D. E. Ibbotson, and J. A. Mucha a variety of techniques for attempting to nucleate diamond. Substrate surfaces were roughened using four different kinds of plasma etches as well as sputtering with no success. Also, with the aforementioned methods the nucleation of diamond was not improved by overcoating a silicon wafer with amorphous carbon, amorphous silicon carbide, photoresist, or very rough textured polysilicon. Further, in a paper by Y. Mitsuda, Y. Kojima and T. Yoshida, *Journal of Material Science* 22 (1987) 1557, there is described methods for the abrasion of a silicon surface to permit a sufficient density of nucleation sites and enabling growth into a continuous film by mechanically shaking a silicon wafer for one hour in #1000 diamond powder, which was apparently superior to hand polishing with diamond paste. Electron microscopy revealed that the resulting surface roughness (mean amplitude) was about 10 nanometers. The aforementioned disadvantages are avoided with the processes of the present invention.

There is disclosed in Japanese Patent application abstract No. 2138395/Jun. 1987 a process wherein there is applied to substrates diamond particles at low seeding rates, that is 100,000 particles per square centimeter up to 1,000,000 particles per square centimeter, thus it is believed that continuous diamond films are not generated as is the situation with the process of the present invention wherein high seeding rates are selected. More specifically, this abstract indicates that a gas mixture of hydrocarbon and hydrogen is introduced onto the surface heated to 500° to 1,300° C., and diamond is deposited on the substrate by the pyrolysis of the hydrocarbon. Also, with the process disclosed in this abstract it is indicated that the substrate surface has fine particles with SP3 bonds uniformly scattered; the diamond or other particles were applied as suspensions in methanol; and a dense diamond film with uniform thickness was obtained.

In Canadian Patent No. 628,567 and the article *Growth of Diamond Seed Crystals by Vapor Deposition*, Case Western Reserve University, Volume 19, Number 6, Page 2915, May 1968, Angus et al., there are disclosed methods for growing diamond on seed crystals. Also of similar relevance are U.S. Pat. Nos. 4707,384, the references listed on page 1 of the '384 patent; 3,961,103; 4,060,660; 4,434,188, gas mixture of hydrocarbon and hydrogen selected; 4,490,229; and 4,504,519; Japanese No. 62-133068; and *Nature*, Vol. 248, Apr. 12, 1974, pages 582 to 584.

SUMMARY OF THE INVENTION

It is, therefore, an object of the present invention to provide processes for the preparation of polycrystalline diamond films that possess the advantages illustrated herein.

In yet another object of the present invention there are provided processes wherein continuous polycrystalline diamond films of uniform area coverage are obtained.

In a further object of the present invention there are provided processes wherein polycrystalline diamond films can be obtained at rapid growth or deposition rates.

Another object of the present invention resides in the provision of economical, reproducible processes for the preparation of polycrystalline diamond films.

Also, in a further object of the present invention there are provided reproducible processes for the preparation of polycrystalline diamond films, wherein abrading of the substrate is avoided.

In still a further object of the present invention there are provided processes for the preparation of thin continuous polycrystalline diamond films.

Furthermore, an additional object of the present invention resides in processes for the preparation of thin polycrystalline diamond films wherein nucleation centers of powdered diamond on a substrate are provided.

Another object of the present invention resides in the provision of processes for the preparation of thin, high purity polycrystalline diamond films wherein powdered diamond applied by spin coating from a dispersion thereof functions as nucleation areas or sites for the deposition of suitable condensible gas components.

Additionally, another object of the present invention resides in the provision of processes for the preparation of thin, high purity continuous polycrystalline diamond films wherein powdered diamond with certain parameters applied by dip coating from a dispersion thereof functions as nucleation areas or sites for the deposition of suitable condensible gas components.

Another object of the present invention resides in the provision of processes for the preparation of thin, high purity polycrystalline diamond films wherein powdered diamond applied by spray coating from a dispersion thereof functions as nucleation areas or sites for the deposition of condensible gas components.

Also, there are provided in accordance with the present invention processes for the preparation of thin, high purity polycrystalline diamond films, wherein the diamond vapor deposition is from about 0.1 to about 10 microns per hour.

Additionally, in further objects of the present invention there are provided processes for the preparation of substantially pure polycrystalline diamond films wherein the diamond powder nucleation areas present on a substrate are preferably of an average particle diameter (particle size) of from about 0.1 to about 1 micron, that is substantially no powder is present with a diameter below 0.1 micron, or above 1.0 micron.

In further objects of the present invention there are provided processes for the preparation of substantially pure polycrystalline diamond films wherein the diamond powder nucleation areas on a substrate are present at a density of from about one particle per ten square micron to about one particle per square micron.

Furthermore, in additional objects of the present invention there are provided processes for the preparation of substantially pure polycrystalline diamond films wherein the diamond film is deposited on substrates which are free from imperfections caused by the treatment of these substrates by mechanical abrasive means.

In another object of the present invention there are provided processes for the preparation of substantially pure polycrystalline diamond films, which films evidence excellent adhesion to a substrate.

Also, in further objects of the present invention there are provided processes for the preparation of substantially pure polycrystalline diamond films, wherein the diamond films evidence poor adhesion to the substrate, that is the diamond film can easily be removed from the substrate by mechanical means using Scotch Tape ®, for example. Therefore, high density, for example the powder particle density is equal to or exceeds one particle per square micron and up to 10 particles per square micron, diamond powder seeding enables poor film adhesion; and lower density, for example equal to or less than one particle per square micron and as low as one particle per 10 square microns, diamond powder seeding density permits excellent film adhesion to the substrate. Poor adhesion is of interest since free standing films with one very smooth surface, namely the diamond film-silicon wafer interface, can be obtained, which diamond wafer can be selected as a substrate with excellent electrically insulating and heat conductive properties for the fabrication of microelectronic circuitry thereupon to the underlying substrate.

In further objects of the present invention there are provided processes for the preparation of substantially pure polycrystalline diamond films wherein the substrate is a semiconducting wafer with electronic circuitry thereon.

These and other objects of the present invention are accomplished by the provision of processes for the preparation of polycrystalline diamond. More specifically, in accordance with the present invention there are provided processes for the preparation of substantially pure continuous polycrystalline diamond films by vapor deposition processes. In one specific embodiment of the present invention there are provided economical, reproducible nucleation processes for the preparation of polycrystalline diamond films that can be selected as heat conductive coatings in conjunction with microelectronic circuits and protective coatings in thermal transfer printing applications. Both of these applications involve the integration of diamond thin films with microelectronic circuitry, which is in a stage of partial or substantial completion of fabrication on semiconducting wafer substrates such as silicon wafer substrates and gallium arsenide substrates. Considering the delicate nature of such circuitry and the sensitivity of the functionality and yield of the microelectronic devices to mechanical abrasion processes, one cannot prepare these substrates by, for example, the common prior art practice of mechanically abrading the substrates with the circuitry thereon. With the process of the present invention, there is provided superior nucleation for the diamond films as compared to processes that involve abrading the substrate.

One aspect of the process of the present invention comprises the formation of a dispersed layer of diamond particles of a controlled size, that is an average particle diameter of, for example, from 0.1 to about 1.0 micron, and subsequently applying the particles at a controlled surface area density. These diamond particles can be applied from a diamond particle suspension by the conventional methods of spin coating, dip coating, or spray coating of appropriately formulated suspensions of diamond particles. Specific examples of such formulations and the details of the coating process are disclosed herein. For example, silicon wafers containing thereon heating elements for thermal transfer printing, and the logic driving circuitry for these heaters can be spin coated with the diamond dispersion without damaging the underlying circuitry. The resulting preconditioned, that is powdered, wafers are incorporated in a vacuum system, heated to the desired process temperature and exposed to a vapor stream of desired carbon containing gas mixtures for an effective period of time, after which the wafer is cooled to room temperature, and removed from the vacuum system. Upon completion of this process, the silicon wafers containing the polycrystalline heater elements are covered with a uniform polycrystalline diamond film of the appropriate thickness, for example from about 1.5 to about 3.0 microns, for protective coatings, for example, for thermal transfer printing elements; about one micron for razor blades; and about 10 microns for heat conductive layers and tool bits. This uniform film can be patterned and partially removed by etching processes with conventional microelectronic processing techniques, which include the exposure of the diamond film to a reactive oxygen plasma to remove the diamond film in a spatially selective manner. Substantially, the same process steps are followed for other applications wherein the integration of diamond films with microelectronic circuitry of different functionality is desired.

In one embodiment, the present invention is directed to a process for the preparation of polycrystalline diamond films, which comprises applying to a substrate diamond powder; heating the resulting powdered substrate subsequent to incorporation in a processing apparatus; and introducing a gas into the apparatus, which gas provides a supply of carbon and hydrogen. Further, in another embodiment of the present invention there is provided a process for the preparation of polycrystalline diamond films, which comprises applying to a substrate diamond powder with certain parameters prior to incorporation in a processing apparatus; and introducing a mixture gas into the apparatus, which mixture provides a supply of carbon and hydrogen. Also, in accordance with the present invention there is provided a process for the preparation of continuous polycrystalline diamond films, which comprises applying to a substrate diamond powder in an amount of from about 1 particle per 10 square microns to about 1 particle per square micron, or from about 1 particle per square micron to about 10 particles per square micron, and with an average particle diameter of from about 0.1 to about 0.4 micron; heating the resulting powdered substrate subsequent to incorporation in a deposition chamber; introducing a mixture of gases into the chamber, which gases provide a supply of carbon and hydrogen; and decomposing the gas mixture. Another embodiment of the present invention relates to a process for the preparation of continuous polycrystalline diamond films, which comprises applying to a substrate in an amount of from about 1 particle per 10 square microns to about 1 particle per square micron, or from about 1 particle per square micron to about 10 particles per square micron, and diamond powder with an average particle diameter (particle size) of from about 0.1 to about 0.4 micron; heating the resulting powdered substrate subsequent to incorporation in a processing apparatus such as a deposition, or vacuum chamber or furnace; introducing a mixture of gases into the chamber, which gases provide a supply of carbon and hydrogen; and decomposing the gas mixture. Furthermore, in yet another embodiment the present invention is directed to a process for the preparation of continuous polycrystalline diamond, which comprises applying to a substrate in an amount of from about 1 particle per 10 square microns to about 1 particle per square micron, or from about 1 particle per square micron to about 10 particles per square micron, and diamond powder with an average particle diameter of from about 0.1 to about 0.4 micron; heating the resulting powdered substrate to a temperature of from about 800° to about 900° C. subsequent to incorporation in a vacuum chamber and applying a vacuum of from about 1 mTorr to about 1 Torr; introducing into the chamber a mixture of gases, which gases provide a supply of carbon and hydrogen; and decomposing the gas mixture at total pressures of from about 1 Torr to 100 Torr whereby polycrystalline diamond is formed on the substrate by growth of the powder, which acts as nucleation centers for the carbon vapor.

In another embodiment of the present invention, there are provided processes for the preparation of continuous polycrystalline diamond films, which comprise applying to a substrate in an amount of from about 1 particle per 10 square microns to about 1 particle per square micron, or from about 1 particle per square micron to about 10 particles per square micron, and diamond powder with an average particle diameter of from about 0.1 to about 0.4 micron, and preferably from about 0.1 to about 0.25 micron; heating the substrate in a process chamber at a temperature of from about 700° to about 900° C., and preferably from about 825° to about 850° C.; introducing gas mixtures such as hydrogen, for example an excess of hydrogen, that is 100 parts of hydrogen per one part of other gas with carbon atoms, such as carbonaceous gases, into the process chamber; decomposing the gases whereby the products of decomposition are deposited on the substrate containing the diamond powder; and subsequently cooling, and removing the substrate with the resulting high purity, about 99 percent or greater, and specifically 99.95 percent polycrystalline diamond film thereon.

Examples of substrates include components that will achieve the objectives of the present invention, such as silicon and gallium arsenide wafers, silicon and gallium arsenide wafers containing thereon microelectronic circuitry, quartz, molybdenum, tantalum, nickel, steel, stainless steel, and the like. Generally, the thickness of the wafer substrate is from about 100 microns to about 1 centimeter, and preferably from about 100 to about 1,000 microns. The substrate may be macroscopically flat, such as is the situation for silicon and gallium arsenide wafers and silicon and gallium arsenide wafers containing thereon microelectronic circuitry, or the substrate may be irregularly shaped such as a tool bit like a drill tip or a razor blade.

There is applied to the substrate submicron diamond powder in the amounts indicated herein available from, for example, Penn Scientific of Abington, Pa.; Logitec of Nashua, N.H.; Norton Company of Worchester, Mass.; and Buehler, Inc. of Lake Bluff, Ill. The diamond powder selected usually has particle size, that is an average particle diameter of from about 0.1 to about 1.0 micron, and preferably from about 0.1 to about 0.2 micron as determined by Coulter particle counting techniques and microscopic inspection. The particle diameter of the powdered diamond seed particles should preferably be equal to or less than, for example, from about 0.1 to about 1.0 micron, and preferably from about 0.1 to about 0.2 micron. Also, providing the objectives of the present invention are achieved, there can be selected in place of the diamond powder silicon, silicon oxide, silicon carbide, silicon nitride, boron nitride and aluminum oxide particles. Diamond is known to grow epitaxially on diamond, but not on any of these other seeding material particles. A powder suspension of the aforementioned particles preferably containing diamond is prepared by the mixing thereof with a suitable material such as an aliphatic alcohol, inclusive of isopropanol, which suspension is ultrasonically vibrated at high energies with a microsonic disruptor. Specifically, for example, about 3 milligrams of 0.1 micron diamond powder is admixed in a bottle with 3 milliliters of isopropanol. Therefore, about 0.1 percent by weight of the mixture is powder. Subsequently, the bottle containing the mixture is placed in an ice bath and the microtip of a microsonic disruptor is inserted into the mixture. The microsonic disruptor is, for example, operated at 20 watts for four minutes. An example of a useful microsonic disruptor is TMSD-40 with a one-eighth inch stepped microtip manufactured by Tekmar Company from Cincinnati, Ohio. The vibrating microtip intensely agitates the particles of diamond causing agglomerates to break apart resulting in a suspension of individual diamond particles in an alcohol.

Thereafter, the suspension can be applied to the substrate by conventional coating techniques to provide on the substrate nucleation or seeding areas. Conventional coating techniques include spin, spray or dip coating for substantially flat substrates, and dip or spray coating for irregularly shaped substrates. Spin coating can be accomplished, for example, by the placement of the substrate on a vacuum chuck, which is caused to rotate at rotational speeds of between 1,000 and 10,000 rotations per minute by an electric motor. The rotational speed of the motor as well as its spin time is preset at the desired spin parameters. For example, to achieve a uniform coverage of one 0.1 micron size diamond particle per square micron of surface area of the substrate, which in this embodiment is a 4 inch diameter silicon wafer, the following solution was prepared and applied to the wafer spun at 3,000 rpm for 30 seconds. Three milligrams of diamond powder of an average size of 0.1 micron was admixed with 3 milliliters of commercial grade isopropanol. The resulting isopropanol/powder mixture was exposed to 20 watts of ultrasonic power from a microsonic disruptor for a period of four minutes. Thereafter, the silicon wafer was cleaned with Micro®, a laboratory glass cleaner, rinsed with distilled water, dried with compressed air, and centered on a vacuum chuck in a conventional spin coater. Subsequently, the diamond suspension was poured on the stationary substrate whereby the entire wafer is covered; typically about 3 milliliters is used. Thereafter, the resulting wafer containing the suspension thereover was spun at 3,000 rpm for 30 seconds. After the completion of the process, it was found by electron microscopic inspection techniques that the wafer was uniformly covered with the diamond particles, which were about 1 micron apart.

A larger quantity of the aforesaid suspension can be selected for the dip coating of quartz substrates. Thus, for example, two pieces of one by four inch substrates of 0.125 inch thickness were immersed back to back in the suspension for a period of five seconds. The substrates were then slowly removed from the suspension at a linear retraction speed of one half inch per minute. By microscopic inspection techniques, it was determined that the average particle powder area density was two particles per square micron. Also, a suspension of the diamond powder in isopropanol can be prepared by repeating this procedure for the preparation of a uniform suspension, followed by the spray coating of the suspension on the substrate. A commercially available spray gun, such as sold by VWR, can be selected at propellant air pressures of 5 psi to cover a 4 inch silicon wafer, positioned at a distance of 20 inches from the nozzle, uniformly with diamond particles with an average size of 0.9 micron diameter.

The aforementioned coated substrate member is usually inserted into a container, such as a deposition chamber that is subsequently sealed. This container is generally subjected to a vacuum of from about $10^{-8}$ Torr to about 10 Torr, and preferably from about 1 mTorr to about 10 mTorr with a vacuum pump. Hydrogen gas is admitted to the vacuum chamber at flow rates of from about 1 sccm to about 10,000 sccm, and preferably from about 100 to about 1,000 sccm. Usually admixed with the hydrogen gas is a carbon containing gas wherein the concentration of this gas to the hydrogen gas is from about 0.01 percent to about 10 percent, and is preferably from about 0.1 percent to about 2 percent by volume. Examples of carbon containing gases and vapors are methane, ethane, ethylene, acetylene, acetone, ethanol, carbon oxide, $CCl_4$, $C_2Cl_4H_2$, $CCl_3CF_3$, $CCl_3CH_2OH$, and the like, inclusive of aliphatic hydrocarbons with from about 1 to about 10 carbon atoms. The gas mixture is brought to a total pressure of between 250 mTorr and 300 Torr, and preferably to a pressure of between 20 and 60 Torr. This pressure regulation is accomplished by, for instance, regulating the pump speed of the vacuum pump by throttling with a valve in the exhaust line. The gas mixture is decomposed at these pressures in the vacuum chamber container by, for example, passing the gas over a heated zone at a temperature of from about 1,700° to about 2,400° C., and preferably from about 1,800° to about 2,100° C. Heating of the gas or gases can be accomplished by a number of known means, and heating zones may include the use of refractory metal filament wires, tubes, plates, and the like. Other methods can be employed to accomplish the decomposition of the gas mixture, including specifically passing the gas mixture through a region where there exists a glow discharge plasma of high density, such as generated by the irradiation of the gas with microwaves. Specifically, the gas mixture can be passed through a quartz tube of a diameter of 1 inch, which tube was partially incorporated at the wave amplitude position of a microwave waveguide. A brightly emissive plasma can be readily observed to exist in the gas mixture, which mixture can be brought in contact with the silicon wafer slice to be covered with the diamond film.

These and other methods to decompose gas mixtures into condensable radicals are well known to those skilled in the art, reference publications by S. Matsumoto, Y. Sato, M. Tsutsumi, N. Setaka, *J. Mat. Sci.* 17 (1982) 3106; by M. Kamo, Y. Sato, S. Matsumoto, N. Setaka, *J. Crystal Growth* 62 (1983) 642; by H. Kawarada, K. S. Mar, A. Hiraki, *Jpn. J. Appl. Phys.* 26 (1987) L 1032; and by K. Kurihara, K. Sasaki, M. Kawarada, N. Koshino, *Appl. Phys. Lett.* 52 (1988) 437, the disclosures of which are totally incorporated herein by reference. These different methods for the decomposition of the gases, especially the gas mixture, all yield essentially the same end result and only differ by the time period that is needed to deposit a film of the desired thickness. The gas mixture passes, after introduction into the vacuum system, first through the zone where it is partially decomposed into condensible radicals. The gas stream of radicals and undercomposed gas molecules flows subsequently toward the substrates which are to be covered with diamond films. Prior to the introduction of the gas mixture, the substrates, which have been pre-seeded with the desired surface area density of diamond powder, can be heated at temperatures between about 650° and about 975° C., and preferably at about 850° C. When the gas mixture containing the condensible radicals comes into contact with this heated substrate surface, a surface reaction between the condensible radicals, and primarily the surface of the pre-seeded diamond powder occurs resulting in the additional growth of the diamond crystals present on the surface. For properly formulated gas mixtures well known from the published literature, the additional material is also substantially diamond, growing on the pre-seeded diamond in an epitaxial fashion. The additional growth is primarily in a lateral direction, that is in a direction parallel to the surface of the underlying substrate which supports the pre-seeded diamond powder. After the diamond crystals reach a size which corresponds to the average distance between the pre-seeded nuclei, the adjacent diamond crystals touch and grow into each other thus forming a cohesive thin solid sheet comprised of a multitude of diamond crystals, covering the substrate surface exposed to the vapor stream, and pre-seeded as disclosed herein, in its entirety.

After deposition is complete, as determined by the elapse of time, for example, the heating, the gas flow, and the vacuum are discontinued. The film thickness is gauged by the elapse of time and is predetermined by trial depositions. The substrates are then removed from the chamber, and it was determined, for example, by microscopic and standard crystallographic inspection and analysis techniques that the coating was comprised of an impermeable polycrystalline diamond film. Depending on the specific application, the substrates with the diamond films can be selected for further processing, such as patterning of the diamond films by photolithography and dry etching techniques.

Patterning and etching techniques of thin films in general are well known and often employ standard lithographic techniques. Patterning techniques of natural single crystal diamond material are also well known and described in the published literature, reference N. N. Efremow, M. W. Geis, D. C. Flanders, G. A. Lincoln, N. P. Economou, *J. Vac. Sci. Technol.* B3 (1985) 416, the disclosure of which is totally incorporated herein by reference. In forming the aforementioned patterning, continuous diamond thin films of 3 microns thick were coated with 5,000 Angstroms of evaporated aluminum. They were then spin coated at 5,000 rpm for 30 seconds with positive photoresist, such as KTI 820 27cs. The photoresist is subsequently imagewise exposed to ultraviolet light using, for example, a photographic master to create the image. The image is subsequently developed with standard photolithographic techniques. Thereafter, the aluminum was etched with the aluminum etchant 16:1:1:1 of $H_3PO_4$:$HNO_3$:$CH_3COOH$:$H_2O$. The remaining photoresist is removed with Baker 1,000 stripper. There remains a pattern of aluminum covering the diamond film in places where it remains on the substrate after completion of the patterning process. The development process also renders the diamond surface exposed in places where the diamond film has to be removed to be functional for this particular application. The actual removal of the diamond thin film is accomplished by exposing these areas to a chemically reactive plasma. The dry etching technique itself is well known in the art of microelectronic fabrication, and a variety of apparatuses are available from manufacturers to accomplish the specific task of etching. For example, a Model PK 20 plasma etcher, available from Plasma Therm, Inc., Kresson, N.J., can be selected to etch the diamond films in desired patterns for specific applications as follows. For example, the apparatus was evacuated by vacuum pumps to pressures lower than 1 mTorr. Electronically pure oxygen gas was admitted to the chamber at a flow rate of 1 standard liter per minute and a pressure of 500 mTorr. Radio frequent power of 600 watts was connected to the electrode on which the silicon wafers, which were covered with 3 micron thick diamond films, were placed. There resulted a glow discharge in the oxygen gas producing oxygen radicals by electron impact dissociation, which chemically react with the diamond to form carbon-oxygen molecules which are removed from the vacuum system by pumping. This dry etching process ceases when the diamond film has disappeared and the substrate is nonreactive with the oxygen radicals. The radio frequent power to the electrode was disconnected after 20 minutes, and by microscopic inspection it was determined that the diamond film had disappeared in the exposed areas leaving the crystalline silicon wafer. In other areas, it was determined that aluminum was still present. The aluminum was finally removed by etching with the previously described aluminum etchant.

Depending upon the specific application, after the deposition of the continuous diamond film as disclosed herein, free standing diamond films may be obtained, that is diamond films that are not present on a substrate. These free standing films are useful as windows, for example X-ray windows in scientific and medical analytical and diagnostic equipment. The process to obtain these free standing films is substantially similar as disclosed herein with the additional step of dissolving the substrate after the deposition of the diamond film in a suitable solvent chemical that does not react at a significant rate with the diamond film. However, a variation on the process illustrated permits a simpler diamond film separation from the substrate. For example, pre-seeding densities of the submicron diamond powder at surface area densities exceeding approximately five particles per square micron result in the deposition of continuous diamond films which are less adherent to the substrate than diamond films pre-seeded at lower densities. It is thus possible to remove the diamond film as a continuous thin sheet, after the deposition process of the diamond film, by pulling the film loose from the substrate with an adhesive medium attached to the surface of the film. A variety of adhesive agents can be used, such as Scotch Tape ® and other adhesive tapes, but also glues such as cyanoacrylates have been found useful in this respect.

The invention will now be described in detail with reference to specific preferred embodiments thereof, it being understood that these examples are intended to be illustrative only. The invention is not intended to be limited to the materials, conditions, or process parameters recited herein, it being noted that all parts and percentages are by weight unless otherwise indicated.

EXAMPLE I

A diamond powder spin coating suspension was prepared as follows. One gram of diamond powder with an average diameter of 0.1 micron procured from Logitec, Inc. was admixed with 1,000 milliliters of commercial grade isopropanol. The mixture was mechanically vibrated for 20 minutes a high energy of 1,000 watts and ultrasonic frequencies of 20 kHz with a microsonic disruptor stylus that was immersed in the aforementioned mixture. Within about one hour, three milliliters of the suspension was applied to the center of a 3 inch diameter silicon wafer, 300 microns thick, which was then spun at 3,000 rotations per minute in a standard wafer spinner with a vacuum chuck. The spin time was set at 15 seconds and the suspension was automatically dispensed in the center of the wafer at the 3 milliliters amount, at one second before the start of the spin cycle, by an electronically triggered hydraulic mechanism. Thereafter, the silicon wafer was removed from the vacuum chuck and inspected by incorporating it in a scanning electron microscope. It was found that the diamond particles were uniformly spread over the wafer surface at average distances therebetween of about 1 micron, and in an amount of about 1 particle per square micron.

Upon removal from the microscope, the seeded wafer was incorporated in a quartz vacuum reactor tube of 5 inch diameter and 30 inch length. This tube was part of a vacuum diffusion furnace which can be evacuated to pressures lower than 1 mTorr and be heated to temperatures exceeding 1,000° C. The pre-seeded wafer was incorporated into the chamber by affixing it to a tantalum plate and by mechanically clamping the wafer to this plate. A tungsten filament fabricated from preannealed tungsten wire of 0.04 inch diameter with 10 turns of 0.5 inch diameter each and a pitch of ¼ inch was positioned at a distance of 0.8 inch from the surface of the silicon wafer. The tungsten filament was connected to electrical vacuum feedthroughs, which feedthroughs are connected to a high current dc power supply with the capability of delivering 100 Amperes at 50 Volts. The furnace tube was evacuated to pressures less than 1 mTorr, and the furnace containing the quartz tube was heated to 850° C. Hydrogen gas was admitted to the furnace vacuum system, which was contained in the furnace at a flow rate of 100 sccm, and methane was flowed into the system at 1.5 sccm. The total pressure of the gas mixture in the reactor tube was adjusted by a throttle valve to 35 Torr. Subsequently, the tungsten filament was heated by an electrical current to a temperature of 2,000° C. as measured by an optical pyrometer. The process was allowed to proceed under these stationary conditions for 10 hours, after which the current to the filament was terminated, the gas flows terminated, the reactor was cooled down to room temperature and brought back to atmospheric pressure.

The silicon wafer was removed from the vacuum system and it was determined using standard analytical techniques including X-ray diffraction, scanning, and transmission electron microscopy, that the wafer was covered with a three micron thick diamond film of a polycrystalline nature with an average crystal diameter of 1.3 microns. The film purity was determined by standard analytical techniques, including secondary ion mass spectroscopy, X-ray diffraction, and electron microprobe analysis. The element carbon was determined to be the predominant constituent of the film. The elements silicon, nitrogen, hydrogen and oxygen were found to be present at the combined level of less than 500 atomic parts per million. Also, Raman spectroscopy was used to determine the carbon bonding in the film, and it was determined that the vibration absorption at 1,332 $cm^{-1}$ was the only absorption peak. This peak is characteristic of diamond bonding. Specifically, no absorption at 1,550 $cm^{-1}$, characteristic of graphitically bonded carbon, was noted. The films are, therefore, primarily constituted out of tetrahedrally bonded carbon, that is diamond with a purity of 99.95 percent.

EXAMPLE II

A diamond powder spin coating suspension was prepared by repeating the procedure of Example I. Within one hour after preparation, five milliliters of the suspension was applied to the center of a 4 inch diameter silicon wafer. The silicon wafer was preprocessed to contain microelectronic circuitry thereon by conventional microelectronic processing techniques. Specifically, the crystalline wafer was processed to contain an array of linear amplifiers and specially formulated resistor elements to form the resistor plates of thermal transfer resistor pads. The processed wafer was then spun at 3,000 rotations per minute in a standard wafer spinner with vacuum chuck, electronically adjustable rotational speed, and spin time. The spin time was set at 15 seconds, and the suspension was automatically dispersed at the 5 milliliters amount, at one second into the spin cycle, by an electronically triggered hydraulic mechanism.

Upon removal of the wafer from the spinner, the seeded wafer was incorporated in a quartz vacuum tube of 5 inch diameter and 30 inch length. This tube was part of a vacuum diffusion furnace and can be evacuated to pressures lower than 1 mTorr and be heated to temperatures exceeding 1,000° C. The pre-seeded wafer is incorporated by affixing it to a tantalum plate and by mechanically clamping the wafer to the plate. Two tungsten filaments fabricated from preannealed tungsten wire of 0.04 inch diameter with 10 turns of 0.5 inch diameter each and a pitch of ¼ inch are positioned at a distance of 0.8 inch from the surface of the silicon wafer. The tungsten filaments were connected to electrical vacuum feedthroughs, which feedthroughs are connected to a high current dc power supply. Thereafter, the furnace tube was evacuated to pressures less than 1 mTorr, and the furnace containing the quartz tube was heated to 850° C. Hydrogen gas was admitted to the vacuum system at a flow rate of 100 sccm, and acetone vapor was flowed into the system at 5.0 sccm. The total pressure of the vapor in the reactor tube was adjusted by a throttle valve to 35 Torr. The filaments were heated by an electrical current to temperature of 2,000° C. as measured by an optical pyrometer. The process was allowed to proceed under these stationary conditions for one hour, after which the current to the filament was terminated, the gas flow was stopped, the reactor was cooled down to room temperature and brought back to atmospheric pressure.

The preprocessed silicon wafer was then removed from the vacuum system and it was determined, using standard analytical techniques including X-ray diffraction, scanning, and transmission electron microscopy, that the wafer was covered with a two micron thick diamond film of a polycrystalline nature and an average crystal size of 1.2 microns. The wafer with the continuous diamond thin film of 2 microns thick was coated with 5,000 Angstroms of evaporated aluminum and spin coated at 5,000 rpm for 30 seconds with a positive photoresist. The photoresist was subsequently imagewise exposed to ultraviolet light with a photographic master image to create the image in such a way as to remove the diamond film everywhere except at the location of the resistor elements which form the heater elements. The image is subsequently developed with a photoresist developer commercially available. Thereafter, the aluminum was etched with the aluminum etchant 16:1:1:1 of $H_3PO_4$:$HNO_3$:$CH_3COOH$:$H_2O$. The remaining photoresist was removed with a Baker 1,000 stripper. There remains a desired pattern of aluminum covering the diamond film on the substrate after completion of the patterning process. The development process also renders the diamond surface exposed in places where the diamond film has to be removed in order to be functional for the particular application. The actual removal of the diamond thin film was accomplished by exposing these areas to a chemically reactive oxygen plasma. A Model PK 20 plasma etcher, available from Plasma Therm, Inc. from Kresson, N.J., was used to etch the diamond film in desired patterns for specific applications as follows.

The vacuum system reactor apparatus was evacuated by vacuum pumps to pressures lower than 1 mTorr.

Electronically pure oxygen gas was then admitted to the chamber at a flow rate of 1 standard liter per minute and a pressure of 500 mTorr. Radio frequent power of 600 watts was connected to the electrode with the silicon wafers covered with 2 microns thick diamond films. The radio frequent power to the electrode was disconnected after 20 minutes, and by microscopic inspection it was determined that the diamond film had disappeared in the exposed areas leaving the processed crystalline silicon wafer intact. In other areas, it was determined that aluminum was still present. The aluminum was finally removed by etching with the aforesaid aluminum etchant. The silicon wafer with the diamond pattern thus obtained was further processed by well known metallization and dicing methods.

The thermal transfer printing devices fabricated were completely functional, producing high resolution images, and exhibiting superior life time due to the presence of the diamond film. Specifically, devices thus fabricated did not evidence failure associated with the abrasion of the resistor elements by a donor paper roll.

Also, the diamond film purity was determined by standard analytical techniques, including secondary ion mass spectroscopy, X-ray diffraction and electron microprobe analysis. The element carbon was determined to be the predominant constituent of the film. The elements silicon, nitrogen, hydrogen, and oxygen were found to be present at the combined level of less than 500 atomic parts per million. Also, Raman spectroscopy was used to determine the carbon bonding in the film, and it was determined that the vibration absorption at 1,332 $cm^{-1}$ was the only absorption peak. This peak is characteristic of diamond bonding. Specifically, no absorption at 1,550 $cm^{-1}$, characteristic of graphitically bonded carbon, was noted. The films are, therefore, primarily constituted out of tetrahedrally bonded carbon, that is diamond of a purity of 99.95 percent.

EXAMPLE III

A diamond powder spin coating suspension was prepared by repeating the procedure of Example I. Within one hour after preparation, 5 cubic centimeters of the suspension were applied to the center of a 4 inch diameter silicon wafer with a total average thickness of 375 microns. The pre-seeded wafer was then spun at 3,000 rotations per minute in a standard wafer spinner with a vacuum chuck, electronically adjustable rotational speed, and spin time. The spin time was set at 15 seconds and the suspension was automatically dispersed at the 5 cc amount, at one second into the spin cycle, by an electronically triggered hydraulic mechanism. Upon removal of the wafer from the spinner, the seeded wafer was incorporated in a quartz vacuum tube of 5 inch diameter and 30 inch length. The pre-seeded wafer was incorporated by affixing it to a tantalum plate and by mechanically clamping the wafer to the plate. Two tungsten filaments fabricated from preannealed tungsten wire of 0.04 inch diameter with 10 turns of 0.5 inch diameter each and a pitch of ¼ inch were positioned at a distance of 0.8 inch from the surface of the silicon wafer. The tungsten filaments were connected to electrical vacuum feedthroughs, which feedthroughs are connected to a high current dc power supply. The furnace tube was evacuated to pressures less than 1 mTorr, and the furnace containing the quartz tube was heated to 850° C. Hydrogen gas was admitted to the vacuum system at a flow rate of 100 sccm and acetone vapor was flowed into the system at 5.0 sccm. The total pressure of the vapor in the reactor tube was adjusted by a throttle valve to 35 Torr. The filaments were heated by an electrical current to a temperature of 2,000° C., as measured by an optical pyrometer. The process was allowed to proceed under these stationary conditions for five hours after which the current to the filament was terminated, the gas flow was stopped, the reactor was cooled down to room temperature, and brought back to atmospheric pressure.

Subsequently, the silicon wafer was removed from the vacuum system and it was determined using standard analytical techniques, including X-ray diffraction, scanning, and transmission electron microscopy, that the wafer was covered with a 10 micron thick polycrystalline diamond film with an average crystal size of 1.1 microns. The film purity was determined by standard analytical techniques, including secondary ion mass spectroscopy, X-ray diffraction, and electron microprobe analysis. The element carbon was determined to be the predominant constituent of the film. The elements silicon, nitrogen, hydrogen, and oxygen were found to be present at the combined level of less than 500 atomic parts per million. Also, Raman spectroscopy was used to determine the carbon bonding in the film, and it was determined that the vibration absorption at 1,332 $cm^{-1}$ was the only absorption peak. This peak is characteristic of diamond bonding. Specifically, no absorption at 1,550 $cm^{-1}$, characteristic of graphitically bonded carbon, was noted. The films are, therefore, primarily constituted out of tetrahedrally bonded carbon, that is diamond with a purity of 99.95 percent.

The wafer with the continuous diamond thin film of 10 microns thick was further processed by cutting the wafer in pieces of 1 centimeter long and 250 microns wide. These pieces were bonded by the mediation of a zinc oxide/molybdenum sulfide loaded intermediary silicone grease to a gallium arsenide/aluminum gallium arsenide solid state laser of dimensions 1 centimeter wide, 250 microns long, and 100 microns thick in such a way that the diamond polycrystalline film was in close contact with the broad side of the solid state laser, thus, by virtue of the excellent thermal conductivity of the diamond material, providing a heat conductive layer for the solid state laser. The solid state laser thus processed was tested to emit infrared light at 820 nanometers wavelength at power densities of 100 milliwatts continuous output.

EXAMPLE IV

A diamond powder spin coating suspension was prepared by repeating the procedure of Example I. Within one hour after preparation, five cubic centimeters of the suspension was applied to the center of a 4 inch diameter silicon wafer with a total average thickness of 225 microns. The pre-seeded wafer was then spun at 3,000 rotations per minute in a standard wafer spinner with a vacuum chuck, electronically adjustable rotational speed, and spin time. The spin time was set at 15 seconds and the suspension was automatically dispersed at the 5 milliliters amount, at one second into the spin cycle, by an electronically triggered hydraulic system.

Upon removal of the wafer from the spinner, the seeded wafer was incorporated in a quartz vacuum tube of 5 inches diameter and 30 inches length. The pre-seeded wafer was incorporated by affixing it to a tantalum plate and by mechanically clamping the wafer to the plate. Two tungsten filaments fabricated from preannealed tungsten wire of 0.04 inch diameter with 10 turns of 0.5 inch diameter each and a pitch of ¼ inch were positioned at a distance of 0.8 inch from the surface of the silicon wafer. The tungsten filaments were connected to electrical vacuum feedthroughs, which feedthroughs were connected to a high current dc power supply. The furnace tube was evacuated to pressures less than 1 mTorr, and the furnace containing the quartz tube was heated to 850° C. Hydrogen gas was admitted to the vacuum system at a flow rate of 100 sccm and acetone vapor was flowed into the system at 5.0 sccm. The total pressure of the vapor in the reactor tube was adjusted by a throttle valve to 35 Torr. The filaments were heated by an electrical current to temperature of 2,000° C. as measured by an optical pyrometer. The process was allowed to proceed under these stationary conditions for 50 hours, after which the current to the filament was terminated, the gas flow was stopped, the reactor was cooled down to room temperature and brought back to atmospheric pressure.

The silicon wafer was removed from the vacuum system and it was determined using standard analytical techniques, including X-ray diffraction, scanning and transmission electron microscopy, that the wafer was covered with a 100 microns thick diamond film of a polycrystalline nature and an average crystal size of 1.0 micron. The film purity was determined by standard analytical techniques, including secondary ion mass spectroscopy, X-ray diffraction and electron microprobe analysis. The element carbon was determined to be the predominant constituent of the film. The elements silicon, nitrogen, hydrogen, and oxygen were found to be present at the combined level of less than 500 atomic parts per million. Also, Raman spectroscopy was used to determine the carbon bonding in the film, and it was determined that the vibration absorption at 1,332 cm$^{-1}$ was the only absorption peak. This peak is characteristic of diamond bonding. Specifically, no absorption at 1,550 cm$^{-1}$, characteristic of graphitically bonded carbon, was noted. The films are, therefore, primarily constituted out of tetrahedrally bonded carbon, that is diamond with a purity of 99.95 percent.

The wafer with the continuous diamond thin film of 100 microns thick was further processed by dissolving the silicon wafer in a mixture of 35 percent nitric acid and 65 percent hydrofluoric acid. The diamond film was in no detectable way attacked by the acid and remained behind as a polycrystalline wafer. Upon removal of the diamond wafer from the acid, and cleaning of the wafer in boiling water and subsequent drying of the wafer, its physical properties were observed. The diamond slab exhibited a poor optical transparency in that the wafer appeared grey-black and not transparent to visible light. The surface of the wafer, which had been exposed to the vapor, exhibited a dull appearance and was subsequently determined to be rough due to protruding microcrystals. The side of the diamond slab, which had been in contact with the silicon wafer, exhibited a very smooth and shiny appearance, not only to the eye but also under microscopic examination. This side has been used as a substrate for the further fabrication of microelectronic devices as follows. A one micron thick layer of polycrystalline silicon was deposited on this side of the diamond wafer by conventional known CVD processes, and further developed into electronic components with high power dissipation including power transistors and power diodes. During the operation of these functional devices, it was found that previously established maximum power dissipation values could be exceeded by an order of magnitude by a factor of ten, because of the superior thermal conductivity of the diamond substrate.

EXAMPLE V

A diamond powder dip coating suspension was prepared as follows. One gram of diamond powder with an average diameter of 0.1 micron was admixed with 2,000 cubic centimeters of commercial grade isopropanol. The mixture was mechanically vibrated for 20 minutes at a high energy of 1,000 watts and ultrasonic frequencies of 20 kHz with a microsonic disruptor stylus immersed in the isopropanol. Within one hour after preparation, a 4 inch diameter silicon wafer was immersed in the suspension for one minute and slowly removed at a speed of 0.29 linear inches per minute by vertically pulling the wafer out of the liquid by means of an adjustable linearly translating chuck, previously attached to the silicon wafer. The silicon wafer was removed from the chuck and inspected by incorporating it in a scanning electron microscope. It was found that the diamond particles were uniformly spread over the wafer surface at average distances of about 1 micron between next nearest neighbor particles.

Upon removal from the microscope, the seeded wafer was incorporated in a quartz vacuum tube of 5 inches diameter and 30 inches length. The pre-seeded wafer was incorporated by affixing it to a tantalum plate and by mechanically clamping the wafer to the plate. Tungsten filaments fabricated from preannealed tungsten wire of 0.04 inch diameter with 10 turns of 0.5 inch diameter each and a pitch of ¼ inch are positioned at a distance of 0.8 inch from the surface of the silicon wafer. The tungsten filaments were connected to electrical vacuum feedthroughs, which feedthroughs were connected to a high current dc power supply. The furnace tube was evacuated to pressures less than 1 mTorr, and the furnace containing the quartz tube was heated to 850° C. Hydrogen gas was admitted to the vacuum system at a flow rate of 100 sccm and methane was flowed into the system at 1.5 sccm. The total pressure of the gas mixture in the reacter tube was adjusted by a throttle valve to 35 Torr. The filaments were heated by an electrical current to a temperature of 2,000° C. as measured by an optical pyrometer. The process was allowed to proceed under these stationary conditions for 10 hours, after which the current to the filament was terminated, the gas flows were stopped, the reactor was cooled down to room temperature and brought back to atmospheric pressure.

The silicon wafer was removed from the vacuum system and it was determined with standard analytical techniques, including X-ray diffraction, scanning, and transmission electron microscopy, that the wafer was covered with a three micron thick polycrystalline diamond film with a crystal size (average particle diameter) of 1.4 microns. The film purity was determined by standard analytical techniques, including secondary ion mass spectroscopy, X-ray diffraction, and electron microprobe analysis. The element carbon was determined to be the predominant constituent of the film. The elements silicon, nitrogen, hydrogen, and oxygen were found to be present at the combined level of less than 500 atomic parts per million. Also, Raman spectroscopy was used to determine the carbon bonding in the film, and it was determined that the vibration absorption at 1,332 cm$^{-1}$ was the only absorption peak. This peak is characteristic of diamond bonding. Specifically, no absorption at 1,550 cm$^{-1}$, characteristic of graphitically bonded carbon, was noted. The films are, therefore, primarily constituted out of tetrahedrally bonded carbon, that is diamond with a purity of 99.95 percent.

EXAMPLE VI

Suspensions of submicron diamond powder in isopropanol were prepared by repeating the process of Example I with the primary exception that the diamond powder was sprayed on the substrate rather than spin coated. Specifically, the commercially available spray gun from VWR was selected at propellant air pressures of 5 psi to cover a 4 inch silicon wafer, positioned at a distance of 20 inches from the nozzle, uniformly with diamond particles with an average size of 0.2 micron diameter. The spray time, an adjustable parameter, was 1.7 seconds as controlled by a shutter mechanism interposed between the spray gun and the silicon wafer substrate. After completion of the spray procedure, the silicon wafer was removed from the chuck and inspected by incorporating it in a scanning electron microscope. It was found that the diamond particles were uniformly spread over the wafer surface at average distances therebetween of about 1 micron.

Upon removal from the microscope, the seeded wafer was incorporated in a quartz vacuum tube of 5 inches diameter and 30 inches length. The pre-seeded wafer was incorporated by affixing it to a tantalum plate and by mechanically clamping the wafer to the plate. Tungsten filaments fabricated from preannealed tungsten wire of 0.04 inch diameter with 10 turns of 0.5 inch diameter each and a pitch of ¼ inch were positioned at a distance of 0.8 inch from the surface of the silicon wafer. The tungsten filaments were connected to electrical vacuum feedthroughs, which feedthroughs are connected to a high current dc power supply. The furnace tube was evacuated to pressures less than 1 mTorr and the furnace containing the quartz tube was heated to 850° C. Hydrogen gas was admitted to the vacuum system at a flow rate of 100 sccm and methane was flowed into the system at 1.5 sccm. The total pressure of the gas mixture in the reactor tube was adjusted by a throttle valve to 35 Torr. The filaments were heated by an electrical current to a temperature of 2,000° C. as measured by an optical pyrometer. The process was allowed to proceed under these stationary conditions for 10 hours, after which the current to the filament was terminated, the gas flows were stopped, the reactor was cooled down to room temperature, and brought back to atmospheric pressure.

The silicon wafer was removed from the vacuum system and it was determined by standard analytical techniques, including X-ray diffraction, scanning, and transmission electron microscopy, that the wafer was covered with a three micron thick diamond film of a polycrystalline nature with an average crystal size of 0.9 micron. The film purity was determined by standard analytical techniques, including secondary ion mass spectroscopy, X-ray diffraction, and electron microprobe analysis. The element carbon was determined to be the predominant constituent of the film. The elements silicon, nitrogen, hydrogen, and oxygen were found to be present at the combined level of less than 500 atomic parts per million. Also, Raman spectroscopy was used to determine the carbon bonding in the film, and it was determined that the vibration absorption at 1,332 cm$^{-1}$ was the only absorption peak. This peak is characteristic of diamond bonding. Specifically, no absorption at 1,550 cm$^{-1}$, characteristic of graphitically bonded carbon, was noted. The films are, therefore, primarily constituted out of tetrahedrally bonded carbon, that is diamond with a purity of 99.95 percent.

Although the invention has been described with reference to specific preferred embodiments, it is not intended to be limited thereto; rather those skilled in the art will recognize variations and modifications may be made therein which are within the spirit of the present invention and within the scope of the following claims.

What is claimed is:

1. A process for the preparation of continuous polycrystalline diamond films which comprises applying to a substrate diamond powder in an amount of from about one particle per ten square microns to about 10 particles per square micron with an average particle diameter of from about 0.1 to about 0.4 micron; heating the resulting powdered substrate subsequent to incorporation in a processing apparatus; introducing a mixture of gases into the apparatus, which gases provide a supply of carbon and hydrogen; and decomposing the gas mixture.

2. A process in accordance with claim 1 wherein the substrate is a semiconductive wafer.

3. A process in accordance with claim 1 wherein the substrate is a semiconductive wafer with microelectronic circuitry thereon.

4. A process in accordance with claim 1 wherein the substrate is a tool bit.

5. A process in accordance with claim 1 wherein the substrate is a razor blade.

6. A process in accordance with claim 1 wherein the substrate comprises an optical device.

7. A process in accordance with claim 1 wherein the diamond powder is applied from a suspension thereof by spin coating, dip coating, or spray coating.

8. A process in accordance with claim 1 wherein the processing apparatus is a deposition chamber.

9. A process in accordance with claim 1 wherein the diamond powder is applied from a suspension thereof by spray coating.

10. A process in accordance with claim 1 wherein the diamond powder is applied from a suspension of diamond powder and an aliphatic compound.

11. A process in accordance with claim 10 wherein the aliphatic compound is an alcohol.

12. A process in accordance with claim 11 wherein alcohol is isopropanol.

13. A process in accordance with claim 1 wherein the average diameter of the particle is from about 0.1 to about 0.25 micron.

14. A process in accordance with claim 1 wherein the powdered substrate is incorporated in a vacuum system.

15. A process in accordance with claim 1 wherein the powdered substrate is heated at a temperature of from about 600° to about 950° C.

16. A process in accordance with claim 1 wherein the powdered substrate is exposed to gases comprised of a mixture of carbonaceous gas and hydrogen at a reduced total pressure of less than 500 Torr.

17. A process in accordance with claim 16 wherein the gas mixture contains from about 0.1 percent to about 5 percent carbonaceous gas.

18. A process in accordance with claim 17 wherein the carbonaceous gas is methane.

19. A process in accordance with claim 17 wherein the carbonaceous gas is acetone vapor.

20. A process in accordance with claim 17 wherein the carbonaceous gas is carbon oxide.

21. A process in accordance with claim 1 wherein the decomposition of the gases is accomplished by heating.

22. A process in accordance with claim 21 wherein the decomposition of the gases is accomplished by heating at a temperature exceeding 1,700° C.

23. A process in accordance with claim 22 wherein the decomposition of the gases is accomplished by heating refractory metal filaments at a temperature exceeding 1,700° C.

24. A process in accordance with claim 1 wherein the decomposition of the gases is accomplished by the formation of a plasma.

25. A process in accordance with claim 24 wherein the decomposition of the gases is accomplished by the formation of a microwave plasma.

26. A process in accordance with claim 24 wherein the decomposition of the gases is accomplished by the formation of a direct current plasma.

27. A process in accordance with claim 24 wherein the decomposition of the gases is accomplished by a radio frequent plasma.

28. A process in accordance with claim 1 wherein the powdered diamond layer has an area coverage of about one particle per ten square microns to about one particle per square micron.

29. A process in accordance with claim 1 wherein the powdered diamond layer has an area coverage of about one particle per square micron to about ten particles per square micron.

30. A process in accordance with claim 1 wherein the polycrystalline diamond layer is of a thickness of from about 0.1 micron to about 1,000 microns.

31. A process for the preparation of continuous polycrystalline diamond which comprises applying to a substrate diamond powder in an amount of from about one particle per ten square microns to about 10 particles per square micron with a particle size of from about 0.1 to about 0.4 micron; incorporating the substrate into a deposition system; applying a vacuum of from about 1 mTorr to about 1 Torr; heating the resulting powdered substrate to a temperature of from about 800° to about 900° C.; introducing into the chamber a mixture of gases or vapors comprised of a carbon containing gas and hydrogen; adjusting the total pressure to from about 10 Torr to about 100 Torr; and decomposing the gas mixture whereby polycrystalline diamond is formed on the substrate on nucleation sites provided by the powder.

32. A process in accordance with claim 31 wherein the substrate is a semiconductive wafer.

33. A process in accordance with claim 31 wherein the diamond powder is applied from a suspension thereof in an aliphatic alcohol.

34. A process in accordance with claim 32 wherein alcohol is methanol.

35. A process in accordance with claim 31 wherein the particle size is from about 0.1 to about 0.25 micron.

36. A process in accordance with claim 31 wherein the powdered substrate is heated at a temperature of from about 800° to about 850° C.

37. A process in accordance with claim 31 wherein the gases are comprised of a mixture of methane and hydrogen.

38. A process in accordance with claim 37 wherein the gas mixture contains from about 0.05 percent to about 5 percent carbon containing gas.

39. A process in accordance with claim 31 wherein the decomposition of the gases is accomplished by heating.

40. A process in accordance with claim 39 wherein the decomposition of the gases is accomplished by heating at a temperature of up to 2,000° C.

41. A process in accordance with claim 31 wherein the decomposition of the gases is accomplished by the formation of a plasma.

42. A process in accordance with claim 32 wherein the substrate is of a thickness of from about 100 microns to about 1,000 microns.

43. A process in accordance with claim 31 wherein the polycrystalline diamond layer is of a thickness of from about 1 micron to about 1,000 microns.

44. A process in accordance with claim 31 wherein the polycrystalline diamond film is deposited at a rate of from about 0.1 to about 1 micron per hour.

45. A process in accordance with claim 1 wherein there results, subsequent to removal from the chamber, substantially pure polycrystalline diamond on the substrate.

46. A process in accordance with claim 31 wherein there results, subsequent to removal from the chamber, substantially pure polycrystalline diamond on the substrate.

47. A process in accordance with claim 1 wherein the powdered diamond is applied from a suspension thereof in alcohol, which suspension is formulated by mixing and ultrasonic vibrations.

48. A process in accordance with claim 31 wherein the powdered diamond is applied from a suspension thereof in alcohol, which suspension is formulated by mixing and ultrasonic vibrations.

49. A process in accordance with claim 1 wherein the decomposition is accomplished with heated refractory metal filament wires.

50. A process in accordance with claim 31 wherein the decomposition is accomplished with heated refractory metal filament wires.

51. A process in accordance with claim 2 wherein the powdered diamond layer has an area coverage of about one particle per ten square microns to about one particle per square micron.

52. A process in accordance with claim 2 wherein the powdered diamond layer has an area coverage of about one particle per square micron to about ten particles per square micron.

53. A process in accordance with claim 2 wherein the polycrystalline diamond layer is of a thickness of from about 0.1 micron to about 1,000 microns.

54. A process in accordance with claim 1 wherein the powdered diamond layer has an area coverage of from about 5 particles per square micron to about 10 particles per square micron.

55. A process in accordance with claim 31 wherein the powdered diamond layer has an area coverage of from about 5 particles per square micron to about 10 particles per square micron.

56. A process in accordance with claim 1 wherein the gas mixture contains a carbon containing gas in an amount of from about 0.1 to about 2 percent by volume.

57. A process in accordance with claim 31 wherein the gas mixture contains a carbon containing gas in an amount of from about 0.1 to about 2 percent by volume.

* * * * *